(12) United States Patent
Balasubramanian et al.

(10) Patent No.: US 11,637,171 B2
(45) Date of Patent: Apr. 25, 2023

(54) PACKAGE-EMBEDDED THIN-FILM CAPACITORS, PACKAGE-INTEGRAL MAGNETIC INDUCTORS, AND METHODS OF ASSEMBLING SAME

(71) Applicant: Intel Corporation, Santa Clara, CA (US)

(72) Inventors: Shivasubramanian Balasubramanian, Gilbert, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/934,873

(22) Filed: Jul. 21, 2020

(65) Prior Publication Data

US 2020/0350396 A1 Nov. 5, 2020

Related U.S. Application Data

(62) Division of application No. 16/020,271, filed on Jun. 27, 2018, now Pat. No. 10,756,161.

(51) Int. Cl.
*H01L 49/02* (2006.01)
*H01L 23/498* (2006.01)
*H01L 23/522* (2006.01)
*H01L 27/08* (2006.01)

(52) U.S. Cl.
CPC ........ *H01L 28/10* (2013.01); *H01L 23/49811* (2013.01); *H01L 23/5227* (2013.01); *H01L 27/08* (2013.01)

(58) Field of Classification Search
CPC ..................................... H01L 49/02
See application file for complete search history.

(56) References Cited

U.S. PATENT DOCUMENTS

| | | | |
|---|---|---|---|
| 2005/0099259 A1* | 5/2005 | Harris ..................... | H01L 24/13 336/200 |
| 2017/0047155 A1* | 2/2017 | Yao ........................... | H01F 3/10 |
| 2020/0006463 A1 | 1/2020 | Balasubramanian et al. | |

OTHER PUBLICATIONS

"U.S. Appl. No. 16/020,271, Restriction Requirement dated Nov. 19, 2019", 5 pgs.
"U.S. Appl. No. 16/020,271, Response filed Jan. 10, 2020 to Restriction Requirement dated Nov. 19, 2019", 11 pgs.
"U.S. Appl. No. 16/020,271, Notice of Allowance dated Mar. 9, 2020", 7 pgs.

* cited by examiner

*Primary Examiner* — Marvin Payen
(74) *Attorney, Agent, or Firm* — Schwegman Lundberg & Woessner, P.A.

(57) ABSTRACT

A semiconductor package substrate includes an integral magnetic-helical inductor that is assembled during assembly of the semiconductor package substrate. The integral magnetic-helical inductor is located within a die footprint within the semiconductor package substrate.

16 Claims, 9 Drawing Sheets

Fig. 5

PACKAGE-EMBEDDED THIN-FILM CAPACITORS, PACKAGE-INTEGRAL MAGNETIC INDUCTORS, AND METHODS OF ASSEMBLING SAME

PRIORITY APPLICATION

This application is a divisional of U.S. application Ser. No. 16/020,271, filed Jun. 27, 2018, which is incorporated herein by reference in its entirety.

FIELD

This disclosure relates to power delivery for semiconductor device packages.

BACKGROUND

Semiconductive device miniaturization connected to device packaging, includes challenges to fit sufficient passives near semiconductive devices, while competing for space on semiconductor package substrates.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Package-integral magnetic-helical inductors (iMHLs) within a semiconductor package substrate portion are manufactured where helical magnetic-coil materials are protected from wet-chemistry issues. The package-integral magnetic-helical inductors are assembled across a lithography ("litho") surface of a layer including a build-up film, such as an Ajinomotobuild-up film (ABF) type. A double-dosed positive photoresist technique allows the for placement of an inductor-center coil and a peripheral magnetic body, where an inductor-center coil is peripherally covered with a first magnetic particle paste or ink that is curable into a magnetic-particle body. The build-up film is opened to connect to bottom-rail portions of the iMHL. The double-dosed (long-dosed) portion of the positive resist is removed and a second layer such as an adjacent build-up film is formed and planarized. Z-height issues for magnetic inductor-coil passives are subsumed within the semiconductor package substrate and within the die shadow. Long-inductive-path issues for magnetic inductor-coil passives are subsumed within the semiconductor package substrate and within the die shadow, to form shortened inductive paths.

Figure 1A:
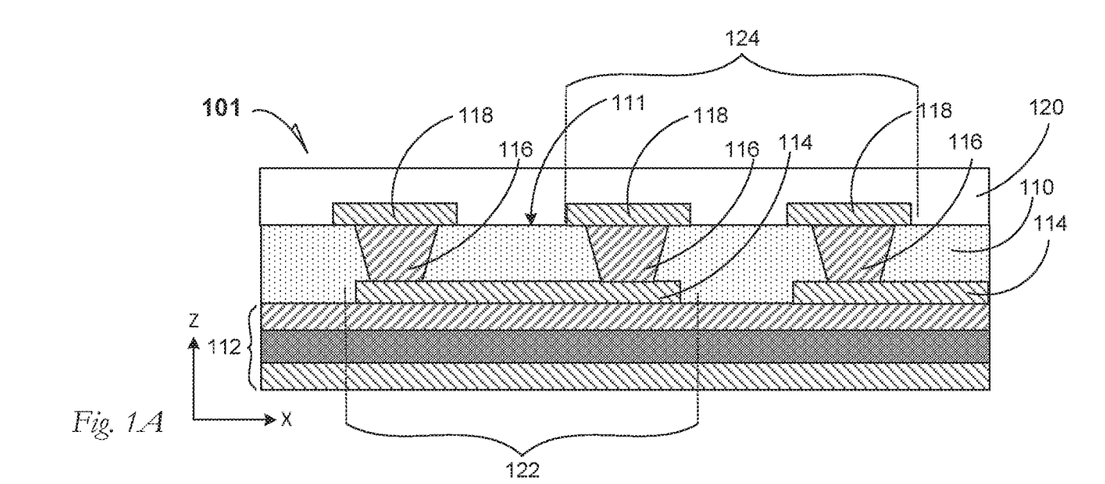
FIG. 1A is a cross-section elevation of a semiconductor package substrate during fabrication of a semiconductor package-integral magnetic-helical inductor (iMHL) according to an embodiment.

FIG. 1A is a cross-section elevation of a semiconductor package substrate 101 during fabrication of a semiconductor package-integral magnetic-helical inductor (iMHL) according to an embodiment.

A first build-up film 110 has been seated upon a carrier 112 after patterning selected bottom rails 114 for a semiconductor package-integral magnetic-helical inductor according to an embodiment. A helical inductor has a shape of segments that complete a 360° turn while moving translationally. The bottom rails 114 are first patterned on the carrier 112, followed by forming, curing and planarizing the first build-up film 110. In an embodiment, a release layer (not pictured) is between the carrier 112 and the bottom rails 114. In any event, the bottom rail 114 abuts the first build-up film 110 opposite the first litho surface 111.

In an embodiment, a first lithographic ("litho") surface 111 is opened by laser drilling, and helix-bottom pillars 116 are filled to contact the bottom rails 114. With a laser-drilling technique, the helix-bottom pillars 116 may have a frusto-conical form factor, but laser-beam adjustment may be used to get the helix-bottom pillar 116 sidewalls substantially vertical, such as an angle between 86° and 90°.

In an embodiment, the first litho surface 111 is opened by patterning a mask (not pictured) and directional etching to obtain substantially vertical sidewalls, such as an angle between 89.5° and 90°, such that the helix-bottom pillars 116 have a right-cylindrical form factor rather than frusto-conical.

After formation of the helix-bottom pillars 116, top bond pads 118 are formed by electrolytic plating such as by patterning a dry mask (not pictured), plating the top bond pads 118 and removing the dry mask. Thereafter, a positive photoresist 120 is laminated over the first litho surface 111 and the top bond pads 118.

In an embodiment the illustrated semiconductor package iMHL includes two coil segments, including a bottom-helix segment that occupies a region approximately covered by the bracket with reference number 122, and a top-helix segment that occupies a region approximately covered by the bracket with reference number 124. In an embodiment, any given helix-bottom pillar 116 is a portion of both a bottom-helix segment 122 and a top-helix segment 124 of a unit cell helix inductor structure.

Figure 1B:
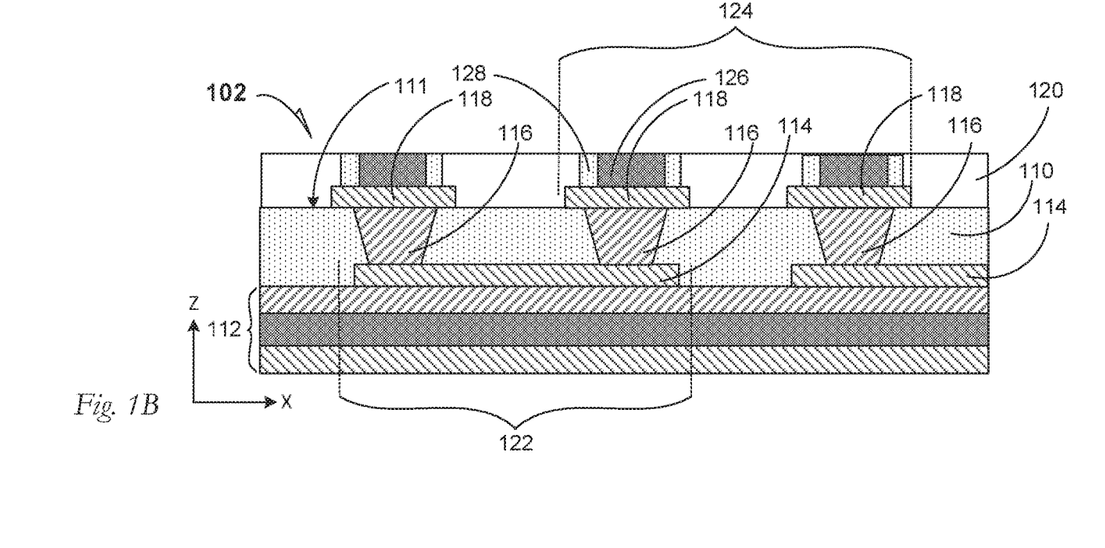
FIG. 1B is a cross-section elevation of the semiconductor package substrate depicted in FIG. 1A after further processing of a semiconductor package iMHL according to an embodiment.

FIG. 1B is a cross-section elevation of the semiconductor package substrate 101 depicted in FIG. 1A after further processing of a semiconductor package iMHL according to an embodiment. Processing of the semiconductor package substrate 102 includes two patterned exposures of the positive photoresist 120. Two regions of photo dosage are formed within the positive photoresist 120. A high-dose region 126 is formed centrally over the top bond pad 118, followed by a long exposure to form a low-dose region 128 that is peripheral to the high-dose region 126. Patterning to form the respective high and low-dose regions 126 and 128, leaves the bulk of the positive photoresist 120 essentially unchanged.

Figure 1C:
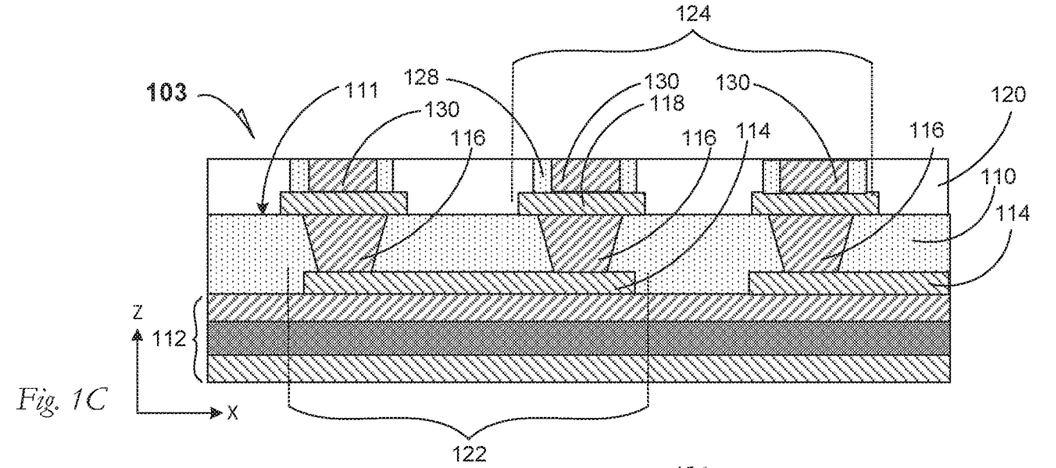
FIG. 1C is a cross-section elevation of the semiconductor package substrate depicted in FIG. 1B after further processing of a semiconductor package iMHL according to an embodiment.

FIG. 1C is a cross-section elevation of the semiconductor package substrate 102 depicted in FIG. 1B after further processing of a semiconductor package iMHL according to an embodiment. Processing of the semiconductor package substrate 103 includes removal of the high-dose region 126 (see FIG. 1B), followed by electroplating a helix-top pillar 130. In an embodiment, processing includes removing the high-dose region 126 by a technique that leaves the low-dose region 128 intact as well as the bulk of the positive photoresist 120, followed by electroplating a conductor such as electronics-grade copper, to achieve the helix-top pillar 130. In an embodiment, the helix-top pillar 130 is a copper-containing conductor. In an embodiment, the helix-top pillar 130 is a silver-containing conductor. In an embodiment, other useful metals are used that are suitable for a given application.

Figure 1D:
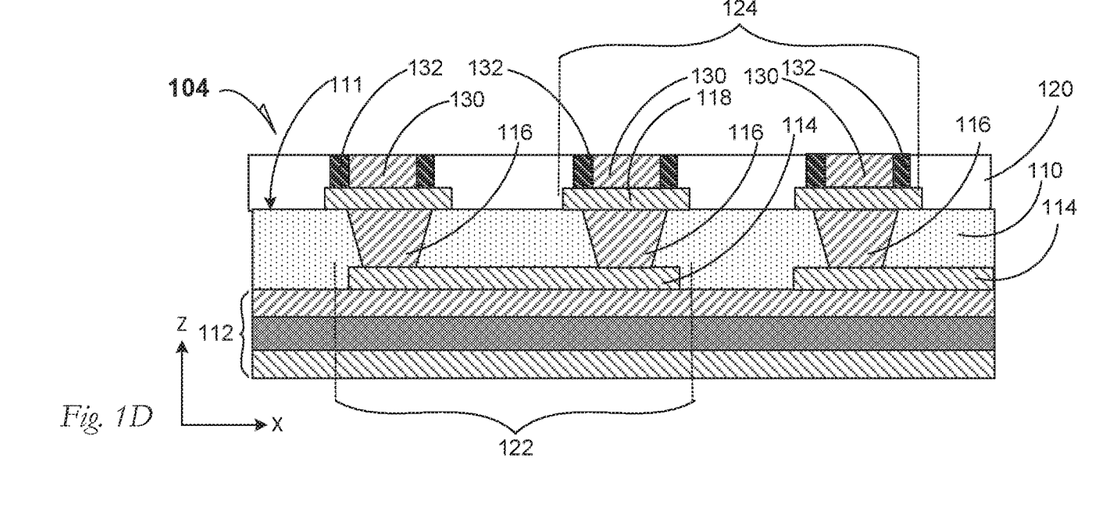
FIG. 1D is a cross-section elevation of the semiconductor package substrate depicted in FIG. 1C after further processing of a semiconductor package iMHL according to an embodiment.

FIG. 1D is a cross-section elevation of the semiconductor package substrate 103 depicted in FIG. 1C after further processing of a semiconductor package iMHL according to an embodiment. Processing of the semiconductor package substrate 104 includes removal of the low-dose region 128 (see FIGS. 1B and 1C), followed by insertion of a green (uncured) magnetic material 132 peripherally to the helix-top pillar 130. In an embodiment, the green magnetic material 132 is a magnetic-particle paste. In an embodiment, the green magnetic material 132 is a magnetic-particle ink. At a useful processing time, the green magnetic material 132 is cured to form a peripheral magnetic body 132.

Figure 1E:
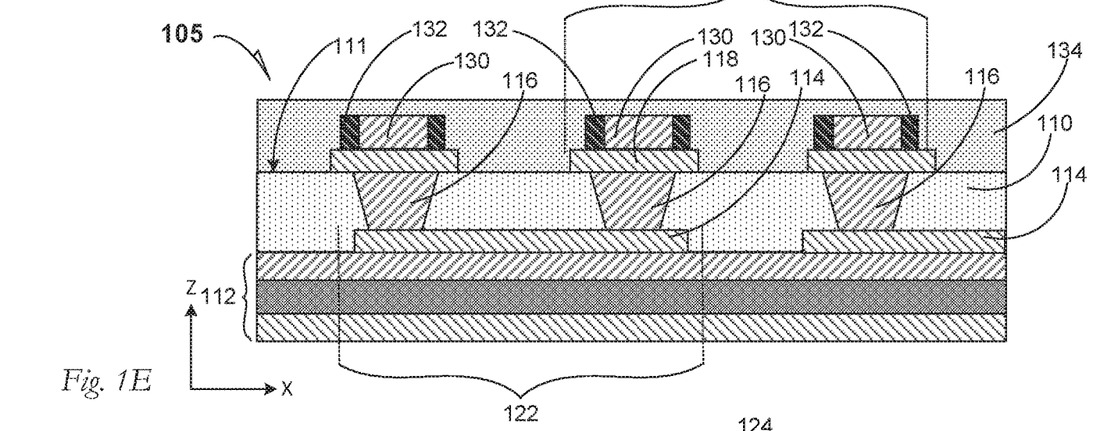
FIG. 1E is a cross-section elevation of the semiconductor package substrate depicted in FIG. 1D after further processing of a semiconductor package iMHL according to an embodiment.

FIG. 1E is a cross-section elevation of the semiconductor package substrate 104 depicted in FIG. 1D after further processing of a semiconductor package iMHL according to an embodiment. Processing of the semiconductor package substrate 105 includes removal of the remaining bulk of the positive photo resist 120 (see FIG. 1D), followed by forming a subsequent and adjacent build-up film 134, where the subsequent and adjacent build-up film 134 covers the first build-up film 110, the top bond pads 118, the helix-top pillars 130 and the peripheral magnetic bodies 132.

Figure 1F:
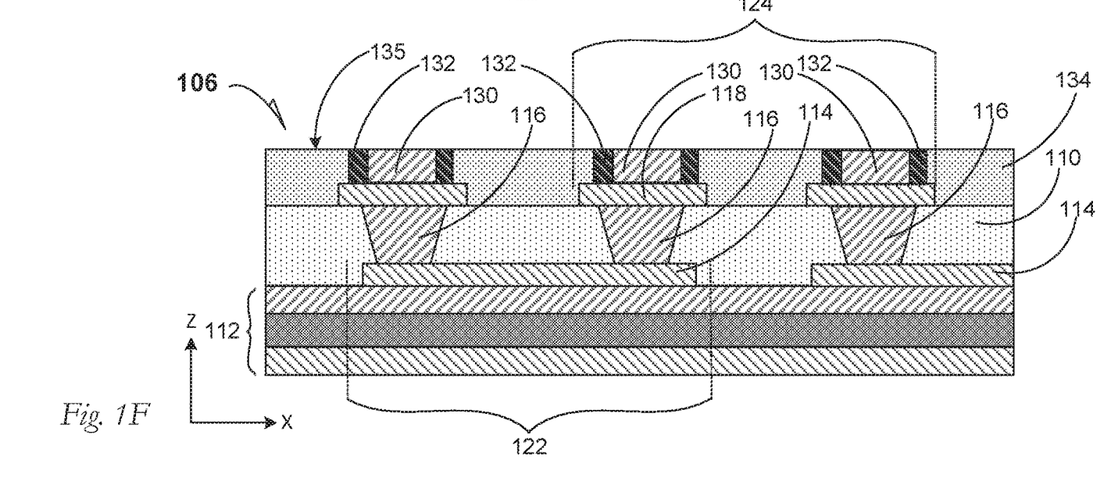
FIG. 1F is a cross-section elevation of the semiconductor package substrate depicted in FIG. 1E after further processing of a semiconductor package iMHL according to an embodiment.

FIG. 1F is a cross-section elevation of the semiconductor package substrate 105 depicted in FIG. 1E after further processing of a semiconductor package iMHL according to an embodiment. Processing of the semiconductor package substrate 106 includes planarizing the subsequent and adjacent build-up film 134 to reach a top surface 135, where also the top bond pads 118, the helix-top pillars 130 and the peripheral magnetic bodies 132 are exposed at a level (Z-direction) of the top surface 135.

Figure 1G:
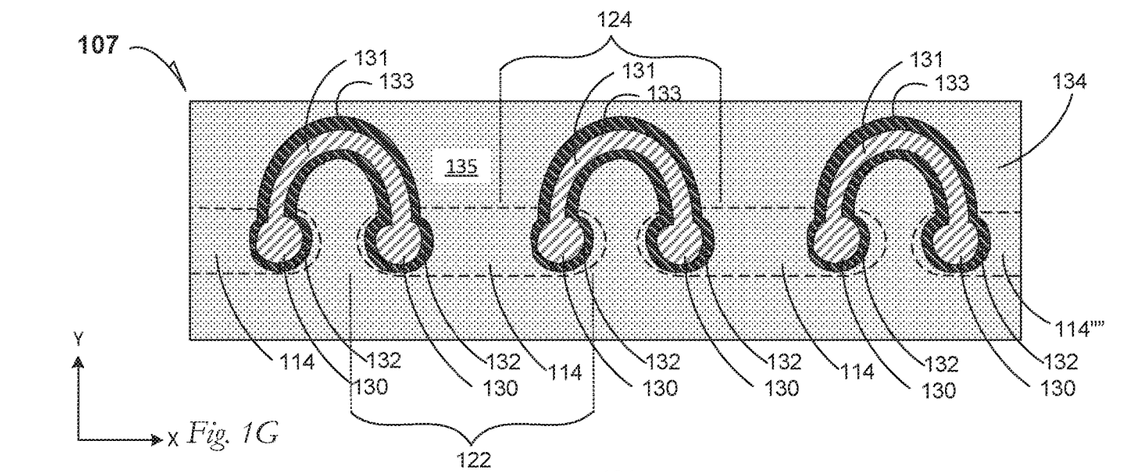
FIG. 1G is a top plan of a semiconductor package integral helix magnetic inductor according to an embodiment.

FIG. 1G is a top plan of a semiconductor package integral helix magnetic inductor 107 according to an embodiment. A portion of the semiconductor package integral helix magnetic inductor 106 depicted in FIG. 1F is mapped to FIG. 1G.

The subsequent and adjacent build-up film 134 is seen at the top surface 135. The helix top pillar 130 is now seen as a single construction of two helix-top pillar portions 130 and a hemi-loop portion 131 between the two helix-top pillar portions 130. Further, the peripheral magnetic body 132 is seen to laterally cover the helix-top pillar portions 130 as well as the hemi-loop portion 131, including a hemi-loop magnetic body portion 133.

Also seen are a complete turn of a helical structure, where the bottom-helix segment 122 and the top-helix segment 124 are located.

Figure 1H:
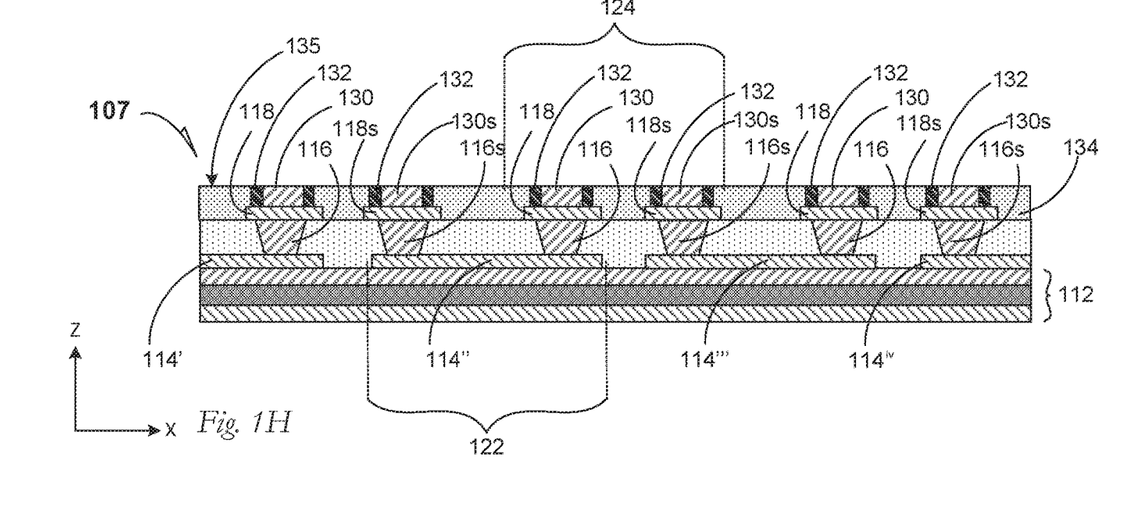
FIG. 1H is a cross-section elevation of the semiconductor package integral helix magnetic inductor depicted in FIG. 1G according to an embodiment.

FIG. 1H is a cross-section elevation of the semiconductor package integral helix magnetic inductor 107 depicted in FIG. 1G according to an embodiment. The bottom-helix segment 122 and the top-helix segment 124 are aligned between FIGS. 1G and 1H.

After processing according to an embodiment, the carrier 112 is removed and the semiconductor package iMHL 107 becomes part of a semiconductor device package.

Terminology for a unit cell helical inductor of a semiconductor package iMHL 107 begins with a first bottom rail 114' as noted in FIG. 1H. The unit cell of a package-integral helix includes the first bottom rail 114' and it terminates adjacent and contacting a subsequent bottom rail 114''. Similarly, a third unit cell of a package-integral helix commences at a third bottom rail 114'''. Also similarly, a fourth unit cell of a package-integral helix commences at a fourth bottom rail 114'' but not all structures to complete the fourth unit cell are illustrated. Items within a given unit cell that are a second occurrence of a like structure, are designated with a suffix "s" such as the second top bond pad 118s. Other second structures include a second helix-top pillar 130s, and a second bottom helix pillar 116s.

Figure 2:
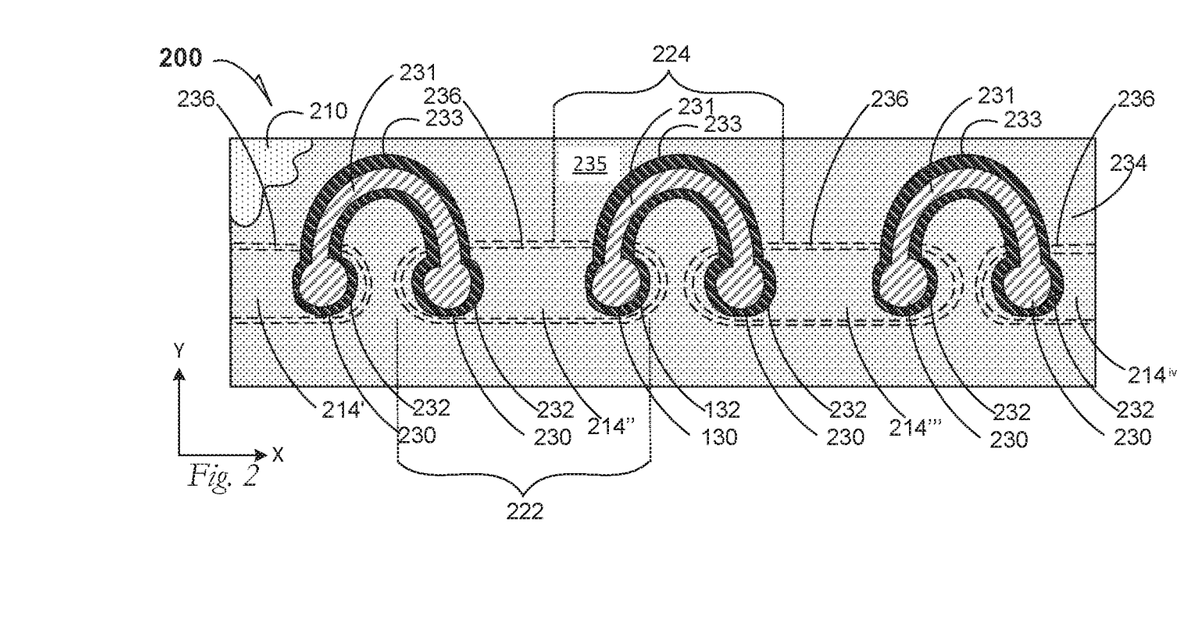
FIG. 2 is a top plan of a semiconductor package integral helix magnetic inductor according to an embodiment.

FIG. 2 is a top plan of a semiconductor package integral helix magnetic inductor 200 according to an embodiment. Several analogous structures from FIGS. 1A through 1H are seen. Helix bottom rails 214', 214'', 214''' and 214$^{iv}$ additionally are peripherally contacted by bottom-rail magnetic bodies 236, which are revealed through a subsequent and adjacent build-up film 234 which is represented as transparent. The subsequent and adjacent build-up film 234 is seen at a top surface 235. A helix top pillar 230 is seen as a single construction of two helix-top pillar portions 230 and a hemi-loop portion 231 between the two helix-top pillar portions 230. Further, a peripheral magnetic body 232 is seen to laterally cover the helix-top pillar portions 230 as well as the hemi-loop portion 231, including a hemi-loop magnetic body portion 233.

According to this embodiment, all lateral (X-Y) current flow during a helical-flow inductive event, is carried out with equivalent lateral occurrences of magnetic bodies 232, 233 and 236.

Processing to achieve the bottom-rail magnetic body 236 is done analogously in FIG. 1A before formation of the first build-up film 110. Consequently in FIG. 2, a first build-up film 210, seen at a cut-away from the subsequent and adjacent build film 234, is in contact with (and below) the subsequent and adjacent build-up film 234. The first build-up film 210 also contacts the helix bottom rails 214', 214'', 214''' and 214$^{iv}$ and the bottom-rail magnetic bodies 236, among other structures analogously seen in FIG. 1F.

After processing according to an embodiment, the carrier is removed and the semiconductor package iMHL 200 becomes part of a semiconductor device package.

Figure 3:
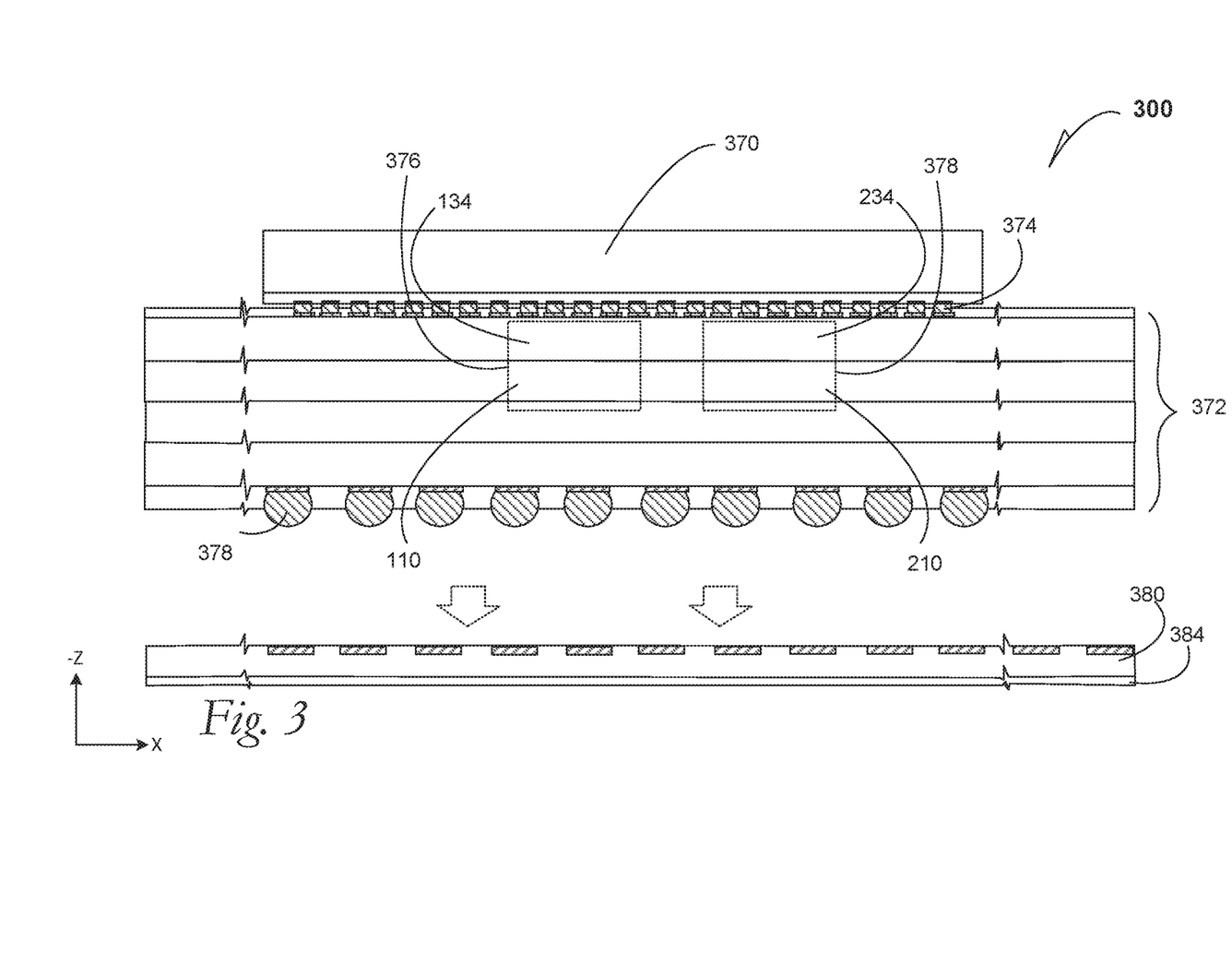
FIG. 3 is a cross-section elevation schematic of a semiconductor device package that includes several semiconductor package integral magnetic-helix inductor embodiments.

FIG. 3 is a cross-section elevation schematic of a semiconductor device package 300 that includes several semiconductor package integral magnetic-helix inductor embodiments. In an embodiment, a semiconductive device 370 is flip-chip mounted on a die-side of a semiconductor package substrate 372 by several electrical bumps 374 at contact bond pads.

In an embodiment, where semiconductor package iMHL 107 depicted in FIGS. 1G and 1H, is mapped to the semiconductor device package 300, the structures of the build-up films 110 and 134 contain most of at least one semiconductor package iMHL embodiment, within a region 376.

In an embodiment, where semiconductor package iMHL 200 depicted in FIG. 2 is mapped to the semiconductor device package 300, the structures of the build-up films 210 and 234 contain most of the semiconductor package iMHL 200 within a region 378.

In an embodiment, the semiconductive device 370 is seated on a semiconductor package substrate that is a coreless substrate 372 that contains at least one iMHL embodiment. In an embodiment, a coreless substrate 372 has no conventional core to resist warpage, but it relies upon inner structures such as lacquer layers stiffeners, or a motherboard for warpage resistance. In an embodiment, the semiconductive device 370 is seated on a semiconductor package substrate that includes a core layer that contains at least one iMHL embodiment.

In an embodiment, at least one semiconductor package integral helical magnetic inductor embodiment is used in a computing system and the computing system that includes a board 380 such as a motherboard 380, that couples to at least one semiconductor package-integral magnetic-helical inductor, by an electrical connection such as an electrical bump, one occurrence of which is indicated with reference number 382. In an embodiment, the board 380 includes a shell 384 that provides both physical and dielectric protection to the semiconductive device 370, which is coupled to at least one semiconductor package-integral magnetic-helical inductor embodiment.

In an embodiment, a die shadow covers approximately an area of a die flip-chip ball grid array, one electrical bump of which is indicated with the reference number 378.

In an embodiment, between two and about 1,000 semiconductor package iMHLs are located within the semiconductor package substrate under a die shadow that is formed by the semiconductive device 370. In an embodiment where the semiconductive device 370 is part of a data server, up to about 1 semiconductor package iMHLs are located under the die shadow. In an embodiment, where the semiconductive device 370 is in a desktop computing system, up to 480 semiconductor package iMHLs are under the die shadow, such as the region 376 or such as the region 378, where a given region, or a combination thereof, extend up to the entire X-Y footprint of the die shadow. In an embodiment, where the semiconductive device 370 is in a desktop handheld or mobile device such as a telephone or tablet computing system, up to 240 semiconductor package iMHLs are under the die shadow, such as the region 376 or such as the region 378, where a given region, or a combination thereof, extend up to the entire X-Y footprint of the die shadow. In an embodiment, the die shadow is represented as the approximate X-Y footprint that the several bond pads that are exposed to the electrical bumps 378 on the die-side of the semiconductor package substrate 372 that are configured for contacting the ball-grid array 378.

Figure 4:
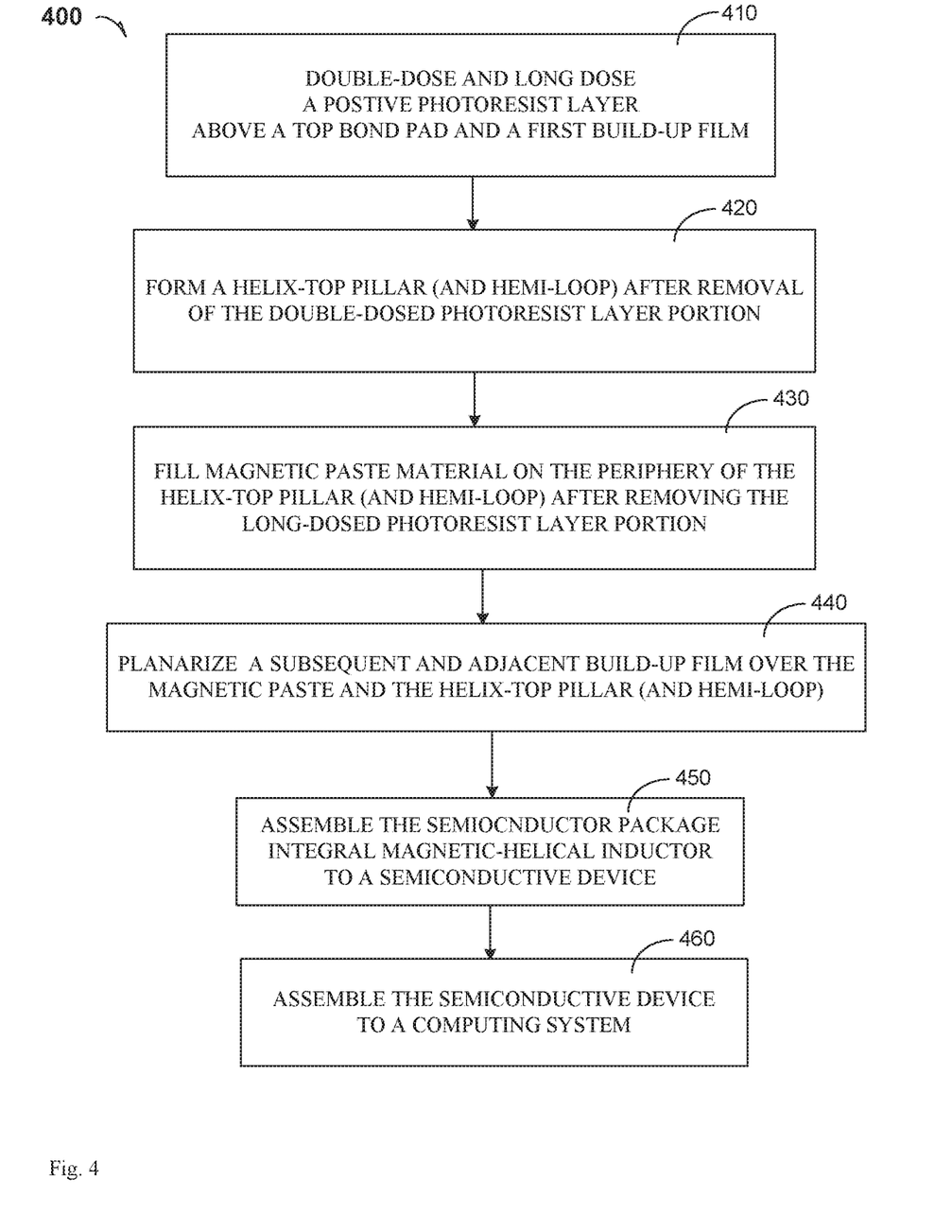
FIG. 4 is a process flow diagram according to several embodiments.

FIG. 4 is a process flow diagram according to several embodiments.

At 410, the process includes double-dosing a positive photoresist layer that is above a top bond pad and a first build-up film.

At 420, the process includes forming a helix-top pillar and hemi-loop after removal of the double-dosed photoresist layer portion.

At 430, the process includes filling magnetic paste material on the periphery of the helix-top pillar and hemi-loop after removal of the long-dosed photoresist layer portion.

At 440, the process includes planarizing a subsequent and adjacent build-up film over the magnetic paste and the helix-top pillar and hemi-loop.

At 450, the process includes assembling the semiconductor package-integral magnetic-helical inductor to a semiconductive device.

At 460, the process includes assembling the semiconductive device to a computing system.

Figure 5:
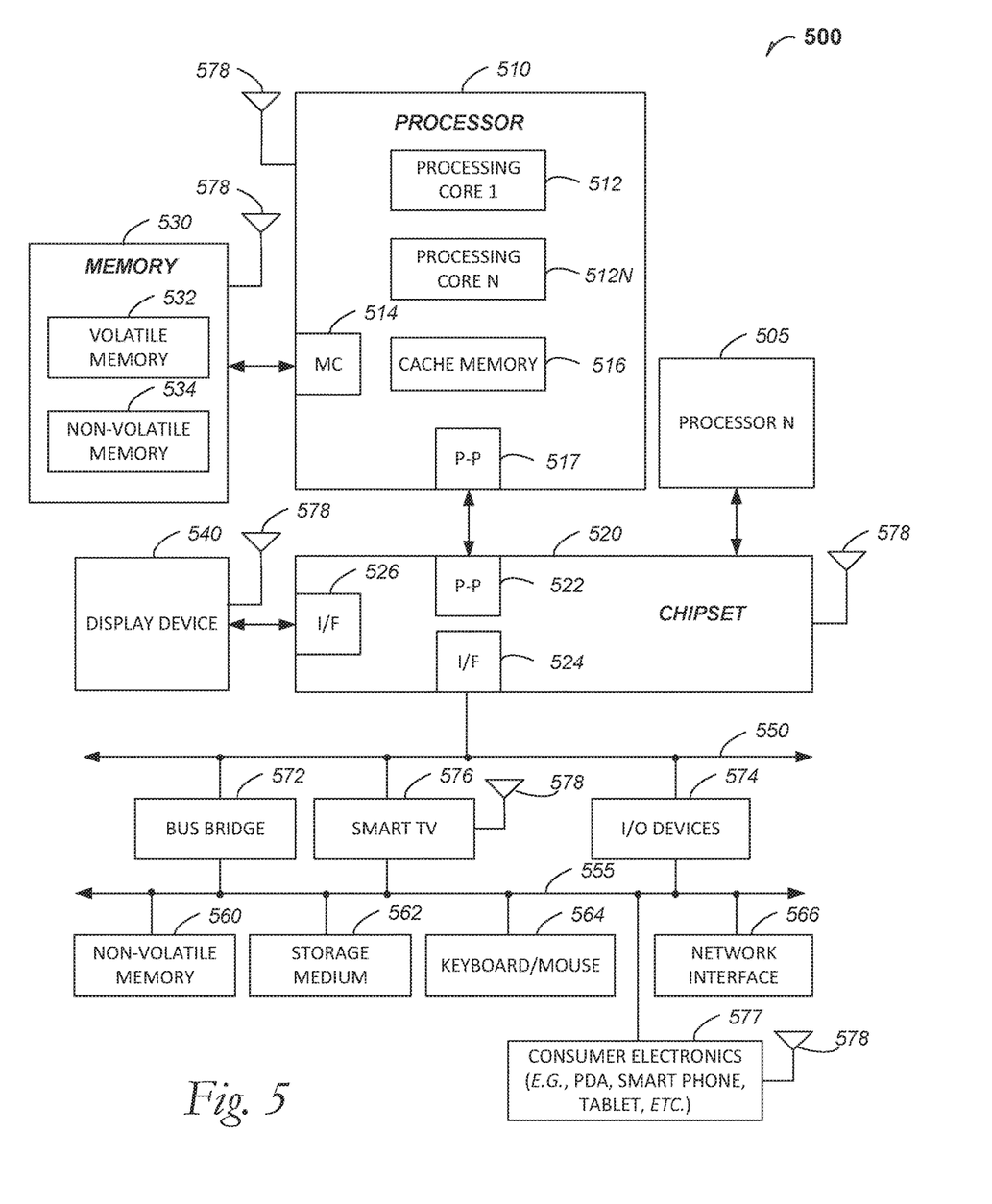
FIG. 5 is included to show an example of a higher-level device application for the disclosed embodiments.

FIG. 5 is included to show an example of a higher-level device application for the disclosed embodiments. The semiconductor package-integral magnetic-helical inductor embodiments may be found in several parts of a computing system. In an embodiment, the semiconductor package-integral magnetic-helical inductor embodiments can be part of a communications apparatus such as is affixed to a cellular communications tower. In an embodiment, a computing system 500 includes, but is not limited to, a desktop computer. In an embodiment, a computing system 500 includes, but is not limited to a laptop computer. In an embodiment, a computing system 500 includes, but is not limited to a tablet. In an embodiment, a computing system 500 includes, but is not limited to a notebook computer. In an embodiment, a computing system 500 includes, but is not limited to a personal digital assistant (PDA). In an embodiment, a computing system 500 includes, but is not limited to a server. In an embodiment, a computing system 500 includes, but is not limited to a workstation. In an embodiment, a computing system 500 includes, but is not limited to a cellular telephone. In an embodiment, a computing system 500 includes, but is not limited to a mobile computing device. In an embodiment, a computing system 500 includes, but is not limited to a smart phone. In an embodiment, a system 500 includes, but is not limited to an internet appliance. Other types of computing devices may be configured with the microelectronic device that includes semiconductor package-integral magnetic-helical inductor embodiments.

In an embodiment, the processor 510 has one or more processing cores 512 and 512N, where 512N represents the Nth processor core inside processor 510 where N is a positive integer. In an embodiment, the electronic device system 500 using a semiconductor package-integral magnetic-helical inductor embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the semiconductor package-integral magnetic-helical inductor in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a semiconductor package-integral magnetic-helical inductor embodiment depicted in FIG. 2. The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random-Access Memory (SDRAM). Dynamic Random-Access Memory (DRAM), RAMBUS Dynamic Random-Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a semiconductor package-integral magnetic-helical inductor embodiment as set forth in this disclosure. The chipset 520 enables the processor 510 to connect to other elements in a semiconductor package-integral magnetic-helical inductor embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a semiconductor package-integral magnetic-helical inductor embodiment in a system. Additionally, the chipset 520 connects to one or more buses 550 and 555 that interconnect various elements 574, 560, 562, 564, and 566. Buses 550 and 555 may be interconnected together via a bus bridge 572 such as at least one semiconductor package-integral magnetic-helical inductor embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid-state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the semiconductor package-integral magnetic-helical inductor embodiments in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

Figure 6:
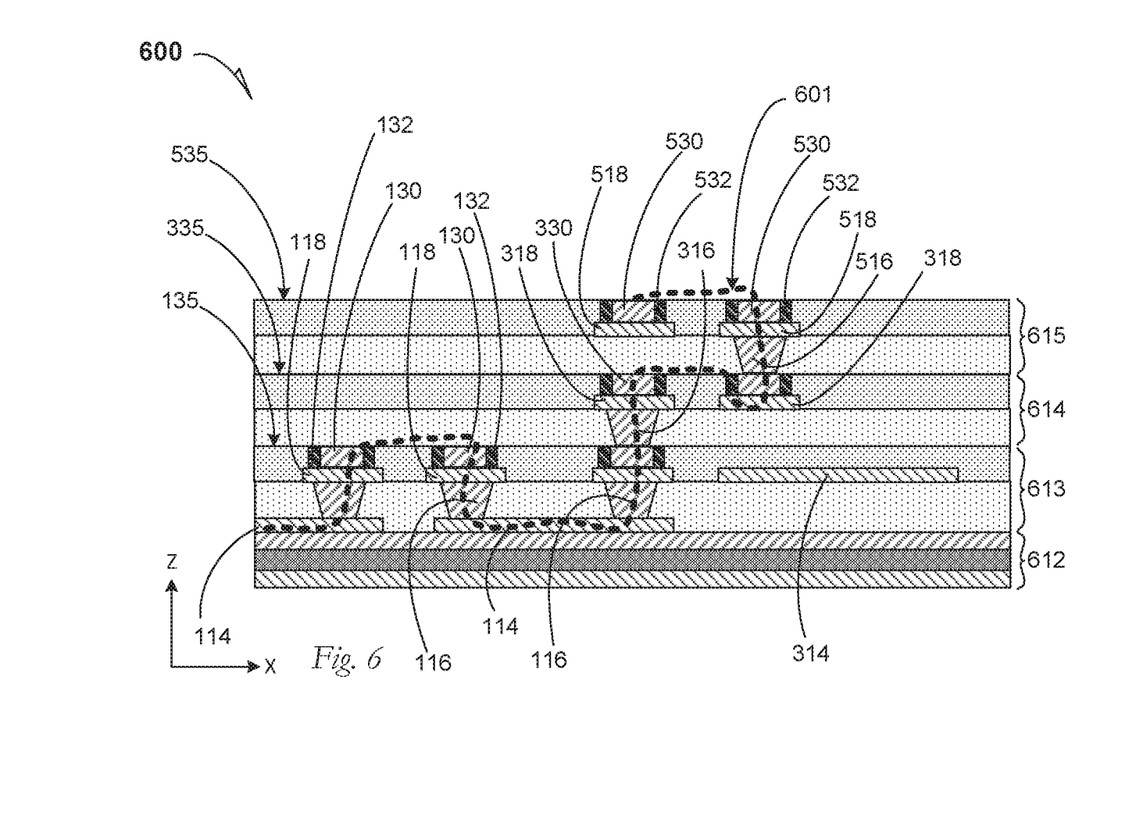
FIG. 6 is a cross-section elevation of a semiconductor package integral helix magnetic inductor according to an embodiment.

FIG. 6 is a cross-section elevation of a semiconductor package integral helix magnetic inductor 600 according to an embodiment. A carrier 612 supports three separate levels of fabrication 613, 614 and 615.

Within the level 613, a top surface 135 indicates a vertical boundary, below which are contained bottom rails 114 that are connected to bottom pillars 116. Top bond pads 118 contact top pillars 130. And the top pillars 130 are contacted by magnetic material 132. Within the level 614, a top surface 335 indicates a vertical boundary, below which are contained bottom rails 314 (one instance) and bottom pillars 316 (one instance). Top bond pads 318 contact top pillars 330 (one instance). And the top pillars 330 are contacted by magnetic material 332. Within the level 615, a top surface 535 indicates a vertical boundary, below which are contained bottom pillars 516 (one instance). Top bond pads 518 contact top pillars 530 (two instances). And the top pillars 530 are contacted by magnetic material 532.

In an event, a continuous current is sustained through all conductive structures, except the bottom rail 314, such that an inductive path is experienced by illustration of the dashed line 601. In an embodiment, the semiconductor package integral helix magnetic inductor 600 includes a first level 613, a second level 614 and a subsequent level 615. Where the dashed line 601 is about a given top surface, e.g. the top surface 135, it represents a hemi-loop 133 such is seen in FIG. 1G. To illustrate the semiconductor package-integral magnetic-helical inductor embodiments and methods disclosed herein, a non-limiting list of examples is provided herein:

Example 1 is a semiconductor package substrate, comprising: a first build-up film including a first lithographic surface; a bottom rail abutting the first build-up film opposite the first lithographic surface; a helix-bottom pillar contacting the bottom rail and penetrating the first build-up film; a top bond pad contacting the helix-bottom pillar and abutting the first lithographic surface; a helix-top pillar contacting the top bond pad and including a hemi-loop that is integral with the helix-top pillar, a peripheral magnetic body that contacts the helix-top pillar, the hemi-loop and the top bond pad; and a subsequent and adjacent build-up film that contacts the first build-up film, the helix-top pillar, the peripheral magnetic body, the hemi-loop and the top bond pad.

In Example 2, the subject matter of Example 1 optionally includes a subsequent and adjacent build-up film includes a top surface, and wherein the helix-top pillar and the peripheral magnetic body are exposed through the subsequent and adjacent build-up film.

In Example 3, the subject matter of any one or more of Examples 1-2 optionally include wherein bottom rail is a first bottom rail, wherein the helix bottom pillar is a first helix bottom pillar, wherein the top bond pad is a first top bond pad, wherein the helix-top pillar is a first helix-top pillar, further including: a second helix-top pillar that is integral with the first helix-top pillar and the hemi-loop, and wherein the peripheral magnetic body contacts the second helix-top pillar; a second top bond pad in contact with the second helix-top pillar; and a second bottom pillar in contact with the second top bond pad.

In Example 4, the subject matter of Example 3 optionally includes a subsequent and adjacent build-up film includes a top surface, and wherein the first helix-top pillar and the peripheral magnetic body are exposed through the subsequent and adjacent build-up film.

In Example 5, the subject matter of any one or more of Examples 1-4 optionally include wherein the bottom rail is peripherally contacted with a bottom-rail magnetic body.

In Example 6, the subject matter of any one or more of Examples 1-5 optionally include wherein bottom rail is a first bottom rail, wherein the helix bottom pillar is a first helix bottom pillar, wherein the top bond pad is a first top bond pad, wherein the helix-top pillar is a first helix-top pillar, further including: a second helix-top pillar that is integral with the first helix-top pillar and the hemi-loop, and wherein the peripheral magnetic body contacts the second helix-top pillar; a second top bond pad in contact with the second helix-top pillar; a second helix-bottom pillar in contact with the second top bond pad; a subsequent bottom rail coupled to the second bottom pillar, wherein the subsequent bottom rail abuts the first build-up film opposite the first lithographic surface; a subsequent helix-bottom pillar contacting the subsequent bottom rail and penetrating the first build-up film; a subsequent top bond pad contacting the subsequent helix-bottom pillar and abutting the first lithographic surface; and a subsequent helix-top pillar contacting the subsequent top bond pad and including a subsequent hemi-loop that is integral with the subsequent helix-top pillar, wherein a subsequent peripheral magnetic body also contacts the subsequent helix-top pillar and the subsequent hemi-loop.

In Example 7, the subject matter of Example 6 optionally includes a subsequent second helix-top pillar that is integral with the subsequent helix-top pillar and the subsequent hemi-loop, and wherein the peripheral magnetic body contacts the subsequent second helix-top pillar; a subsequent second top bond pad in contact with the subsequent second helix-top pillar; and a subsequent second helix-bottom pillar in contact with the subsequent second top bond pad.

In Example 8, the subject matter of any one or more of Examples 1-7 optionally include wherein the hemi-loop a first hemi-loop within a first level, further including a second level above the first level with a second hemi-loop that is coupled to the first hemi-loop, and further including a subsequent level with a subsequent hemi-loop that is coupled to the second hemi-loop.

In Example 9, the subject matter of Example 8 optionally includes wherein the first bottom rail is peripherally contacted with a first bottom-rail magnetic body, and wherein the subsequent bottom rail is peripherally contacted with a subsequent bottom-rail magnetic body.

In Example 10, the subject matter of any one or more of Examples 1-9 optionally include wherein bottom rail is a first bottom rail, wherein the helix bottom pillar is a first helix bottom pillar, wherein the top bond pad is a first top bond pad, wherein the helix-top pillar is a first helix-top pillar, further including: a second helix-top pillar that is integral with the first helix-top pillar and the hemi-loop, and wherein the peripheral magnetic body contacts the second helix-top pillar; a second top bond pad in contact with the second helix-top pillar; a second bottom pillar in contact with the second top bond pad; a subsequent bottom rail coupled to the second bottom pillar, wherein the subsequent bottom rail abuts the first build-up film opposite the first lithographic surface; a subsequent helix-bottom pillar contacting the subsequent bottom rail and penetrating the first build-up film; a subsequent top bond pad contacting the subsequent helix-bottom pillar and abutting the first lithographic surface; a subsequent helix-top pillar contacting the subsequent top bond pad and including a hemi-loop that is integral with the subsequent helix-top pillar, wherein the peripheral magnetic body also contacts the subsequent helix-top pillar and the hemi-loop; a subsequent second helix-top pillar that is integral with the subsequent helix-top pillar and the hemi-loop, and wherein the peripheral magnetic body contacts the subsequent second helix-top pillar; a subsequent second top bond pad in contact with the subsequent second helix-top pillar; a subsequent second bottom pillar in contact with the subsequent second top bond pad; a third bottom rail coupled to the subsequent second bottom pillar, wherein the third bottom rail abuts the first build-up film opposite the first lithographic surface; a third helix-bottom pillar contacting the third bottom rail and penetrating the first build-up film; a third top bond pad contacting the third helix-bottom pillar and abutting the first lithographic surface; a third helix-top pillar contacting the third top bond pad and including a hemi-loop that is integral with the third helix-top pillar, wherein the peripheral magnetic body also contacts the third helix-top pillar and the hemi-loop.

In Example 11, the subject matter of Example 10 optionally includes wherein the first bottom rail is peripherally contacted with a first bottom-rail magnetic body, wherein the subsequent bottom rail is peripherally contacted with a subsequent bottom-rail magnetic body, and wherein the third bottom rail is peripherally contacted with a third bottom-rail magnetic body.

In Example 12, the subject matter of any one or more of Examples 1-11 optionally include wherein the helix-top pillar is a first helix-top pillar, further including: a second helix-top pillar that is integral with the first helix-top pillar and the hemi-loop, and wherein the peripheral magnetic body contacts the second helix-top pillar; a second-helix bottom pillar that contacts the first build-up film, a second bottom rail and a second top bond pad, wherein the second top bond pad contacts the second helix-top pillar.

In Example 13, the subject matter of Example 12 optionally includes a subsequent and adjacent build-up film includes a top surface, and wherein the helix-top pillar and the peripheral magnetic body are exposed through the subsequent and adjacent build-up film.

In Example 14, the subject matter of any one or more of Examples 1-13 optionally include wherein the first build-up film and the adjacent and subsequent build-up film are part of a semiconductor package substrate including a die side and a land side, further including; a semiconductive device disposed on the die side, wherein the semiconductive device is coupled to the helix-top pillar.

Example 15 is a process of forming a semiconductor package substrate, comprising: double-exposing a photoresist layer above a top bond pad and a first build-up film; forming a helix-top pillar after removing a double-exposed portion of the photoresist layer; forming a magnetic body peripherally on the helix-top pillar after removing a long-dosed portion of the positive photoresist layer; and forming a subsequent and adjacent build-up film over the magnetic body and the helix-top pillar.

In Example 16, the subject matter of Example 15 optionally includes planarizing the subsequent and adjacent build-up film to expose at least a portion each of the helix-top pillar and the magnetic body.

In Example 17, the subject matter of any one or more of Examples 15-16 optionally include planarizing the subsequent and adjacent build-up film to expose at least a portion each of the helix-top pillar and the magnetic body; and assembling the first build-up film and the subsequent and adjacent build-up film into a semiconductor package substrate.

In Example 18, the subject matter of any one or more of Examples 15-17 optionally include planarizing the subsequent and adjacent build-up film to expose at least a portion each of the helix-top pillar and the magnetic body; assembling the first build-up film and the subsequent and adjacent build-up film into a semiconductor package substrate; and assembling a semiconductive device to the semiconductor package substrate, under conditions to couple to the helix-top pillar and the peripheral magnetic body.

Example 19 is a computing system, comprising: a semiconductive device; a helical inductor coupled to the semiconductive device, wherein the helical inductor is integral with a semiconductor package substrate, including: a first build-up film including a first lithograph surface; a bottom rail abutting the first build-up film opposite the first lithographic surface; a first helix-bottom pillar contacting the bottom rail and penetrating the first build-up film; a first top bond pad contacting the first helix-bottom pillar and abutting the first lithographic surface; a first helix-top pillar contacting the first top bond pad and including a hemi-loop that is integral with the first helix-top pillar, a peripheral magnetic body that contacts the first helix-top pillar, the hemi-loop and the first top bond pad; a subsequent and adjacent build-up film that contacts the first build-up film, the first helix-top pillar, the peripheral magnetic body, the hemi-loop and the first top bond pad, and wherein the first helix-top pillar and the peripheral magnetic body are exposed through the subsequent and adjacent build-up film; a second helix-top pillar that is integral with the first helix-top pillar and the hemi-loop, and wherein the peripheral magnetic body contacts the second helix-top pillar; a second top bond pad in contact with the second helix-top pillar; a second helix-bottom pillar in contact with the second top bond pad; and wherein the semiconductive device is part of a chipset.

In Example 20, the subject matter of Example 19 optionally includes a board coupled to the semiconductor package substrate, wherein the board includes an external shell that provides dielectric protection for the semiconductive device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:
1. A semiconductor package substrate, comprising:
a first build-up film including a first surface;

a bottom rail abutting the first build-up film opposite the first surface;

a bottom pillar contacting the bottom rail and penetrating the first build-up film;

a top bond pad contacting the bottom pillar and abutting the first surface;

a top pillar contacting the top bond pad and including a hemi-loop that is integral with the top pillar, a peripheral magnetic body that contacts the top pillar, the hemi-loop and the top bond pad; and a subsequent and adjacent build-up film that contacts the first build-up film, the top pillar, the peripheral magnetic body, the hemi-loop and the top bond pad.

2. The semiconductor package substrate of claim 1, further including a subsequent and adjacent build-up film includes a top surface, and wherein the top pillar and the peripheral magnetic body are exposed through the subsequent and adjacent build-up film.

3. The semiconductor package substrate of claim 1, wherein bottom rail is a first bottom rail, wherein the bottom pillar is a first bottom pillar, wherein the top bond pad is a first top bond pad, wherein the top pillar is a first top pillar, further including:

a second top pillar that is integral with the first top pillar and the hemi-loop, and wherein the peripheral magnetic body contacts the second top pillar;

a second top bond pad in contact with the second top pillar; and a second bottom pillar in contact with the second top bond pad.

4. The semiconductor package substrate of claim 3, further including a subsequent and adjacent build-up film includes a top surface, and wherein the first top pillar and the peripheral magnetic body are coplanar with the top of the subsequent and adjacent build-up film.

5. The semiconductor package substrate of claim 1, wherein the bottom rail is peripherally contacted with a bottom-rail magnetic body.

6. The semiconductor package substrate of claim 2, wherein the hemi-loop structure includes integral bond pads at ends of the hemi-loop structure.

7. The semiconductor package substrate of claim 2, wherein the peripheral magnetic body includes magnetic particles embedded in a cured paste.

8. The semiconductor package substrate of claim 2, wherein the hemi-loop structure is within one of the plurality of layers, and wherein at least one end of the hemi-loop structure is coupled to a conductor trace on a different layer in the plurality of layers through a pillar.

9. The semiconductor package substrate of claim 2, wherein the hemi-loop structure and the peripheral magnetic body are laterally encapsulated in dielectric build up material.

10. The semiconductor package substrate of claim 2, wherein the hemi-loop structure includes copper.

11. The semiconductor package substrate of claim 2, wherein the hemi-loop structure includes silver.

12. The semiconductor package substrate of claim 2, wherein a tip surface of the hemi-loop structure and a top surface of the peripheral magnetic body are exposed and co-planar.

13. A semiconductor package substrate, comprising:

a plurality of layers, including conductor traces and dielectric build up material;

a hemi-loop structure coupled to one or more of the conductor traces; and a peripheral magnetic body laterally covering the hemi-loop structure.

14. A semiconductor package substrate, comprising:

a plurality of layers, including conductor traces and dielectric build up material;

a plurality of hemi-loop structures coupled to one or more of the conductor traces; and a peripheral magnetic body laterally covering the plurality of hemi-loop structures.

15. The semiconductor package substrate of claim 14, wherein the plurality of hemi-loop structures are contained within a single layer of the plurality of layers.

16. The semiconductor package substrate of claim 14, wherein at least some of the plurality of hemi-loop structures are coupled together by a plurality of bottom rails.

* * * * *